United States Patent
Sugiura

(10) Patent No.: US 8,843,809 B2
(45) Date of Patent: Sep. 23, 2014

(54) DATA PROCESSING DEVICES, COMPUTER READABLE STORAGE MEDIA, AND METHODS

(75) Inventor: Masatoshi Sugiura, Kariya (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 317 days.

(21) Appl. No.: 13/430,286

(22) Filed: Mar. 26, 2012

(65) Prior Publication Data

US 2013/0007552 A1 Jan. 3, 2013

(30) Foreign Application Priority Data

Jun. 30, 2011 (JP) ................................. 2011-145636

(51) Int. Cl.
| | |
|---|---|
| *H03M 13/00* | (2006.01) |
| *H03M 13/03* | (2006.01) |
| *H04L 1/00* | (2006.01) |
| *H04B 3/46* | (2006.01) |
| *H03M 13/25* | (2006.01) |
| *H04L 12/26* | (2006.01) |
| *H04L 5/14* | (2006.01) |
| *H03M 13/29* | (2006.01) |

(52) U.S. Cl.
CPC ........... *H04L 1/0075* (2013.01); *H03M 13/251* (2013.01); *H03M 13/253* (2013.01); *H04L 12/2652* (2013.01); *H04L 5/1438* (2013.01); *H03M 13/2906* (2013.01); *H04L 12/2647* (2013.01); *H03M 13/03* (2013.01); *H04L 43/0829* (2013.01); *H03M 13/25* (2013.01); *H04L 1/0041* (2013.01)
USPC ........... 714/776; 714/752; 714/786; 714/751; 714/774; 370/216; 375/224

(58) Field of Classification Search
CPC . H03M 13/03; H03M 13/2906; H03M 13/25; H03M 13/251; H03M 13/253; H04L 1/0075; H04L 1/0041; H04L 5/1438; H04L 12/2647; H04L 12/2652; H04L 43/0829
USPC .......... 714/776, 752, 786, 751, 774; 370/216; 375/224
See application file for complete search history.

(56) References Cited

U.S. PATENT DOCUMENTS

| | | | | |
|---|---|---|---|---|
| 6,675,340 | B1 * | 1/2004 | Hardie et al. | 714/751 |
| 7,017,102 | B1 * | 3/2006 | Kristensson et al. | 714/786 |

(Continued)

FOREIGN PATENT DOCUMENTS

| | | |
|---|---|---|
| JP | 2009-171529 A | 7/2009 |
| JP | 2010-119009 A | 5/2010 |

(Continued)

OTHER PUBLICATIONS

Rhee et al., FEC-based Loss Recovery for Interactive Video Transmission—Experimental Study, Nov. 1998, North Carolina State University, pp. 1-23.*

(Continued)

*Primary Examiner* — John J Tabone, Jr.
(74) *Attorney, Agent, or Firm* — Baker Botts L.L.P.

(57) ABSTRACT

A data processing device including a controller configured to control the data processing device to execute steps of: receiving a data packet comprising a group identification information that identifies a restoration group, with which the data packet is associated, and redundant data for restoring a lost data packet, which is associated with the restoration group identified by the group identification information; determining whether a received amount of data packet associated with the restoration group identified by the group identification information is equal to or greater than a predetermined value; and restoring the lost data packet associated with the restoration group identified by the group identification information when the received amount of data packet associated with the restoration group identified by the group identification information is equal to or greater than the predetermined value.

9 Claims, 12 Drawing Sheets

(56) References Cited

U.S. PATENT DOCUMENTS

| | | | |
|---|---|---|---|
| 7,376,880 B2* | 5/2008 | Ichiki et al. | 714/751 |
| 7,853,856 B2* | 12/2010 | Vedantham et al. | 714/776 |
| 7,877,660 B2* | 1/2011 | Ver Steeg | 714/751 |
| 7,904,781 B2* | 3/2011 | Sugai et al. | 714/752 |
| 8,037,392 B1* | 10/2011 | Sahar | 714/776 |
| 8,261,162 B2* | 9/2012 | Doi et al. | 714/776 |
| 8,423,872 B2* | 4/2013 | Sahar | 714/776 |
| 8,472,310 B2* | 6/2013 | Fujita et al. | 370/216 |
| 8,542,723 B2* | 9/2013 | Kihara et al. | 375/224 |
| 8,621,313 B2* | 12/2013 | Le Floch et al. | 714/752 |
| 2008/0134266 A1* | 6/2008 | Kang | 725/110 |
| 2009/0138784 A1* | 5/2009 | Tamura et al. | 714/776 |
| 2009/0201805 A1* | 8/2009 | Begen et al. | 370/225 |
| 2010/0008249 A1 | 1/2010 | Fukuyama et al. | |
| 2011/0243155 A1* | 10/2011 | Gondo et al. | 370/474 |
| 2012/0079339 A1* | 3/2012 | Lu et al. | 714/751 |
| 2013/0058628 A1* | 3/2013 | Sasaki et al. | 386/241 |
| 2014/0075269 A1* | 3/2014 | Sahar | 714/776 |

FOREIGN PATENT DOCUMENTS

| | | |
|---|---|---|
| WO | 2005/086436 A1 | 9/2005 |
| WO | 2008/114450 A1 | 9/2008 |

OTHER PUBLICATIONS

Perkins et al., A Survey of Packet loss Recovery Techniques for Streaming Audio, Sep. 1998, IEEE, pp. 40-48.*

Japan Patent Office, Notice of Reasons for Rejection in counterpart Japanese Application No. 2011-145636, mailed May 20, 2014.

Koji Suzuki et al., "Evaluation of FEC and Buffering for Multiple Paths Real-time Streaming," IPSJ SIG Technical Report (Jan. 27, 2006), vol. 2006, No. 9.

* cited by examiner

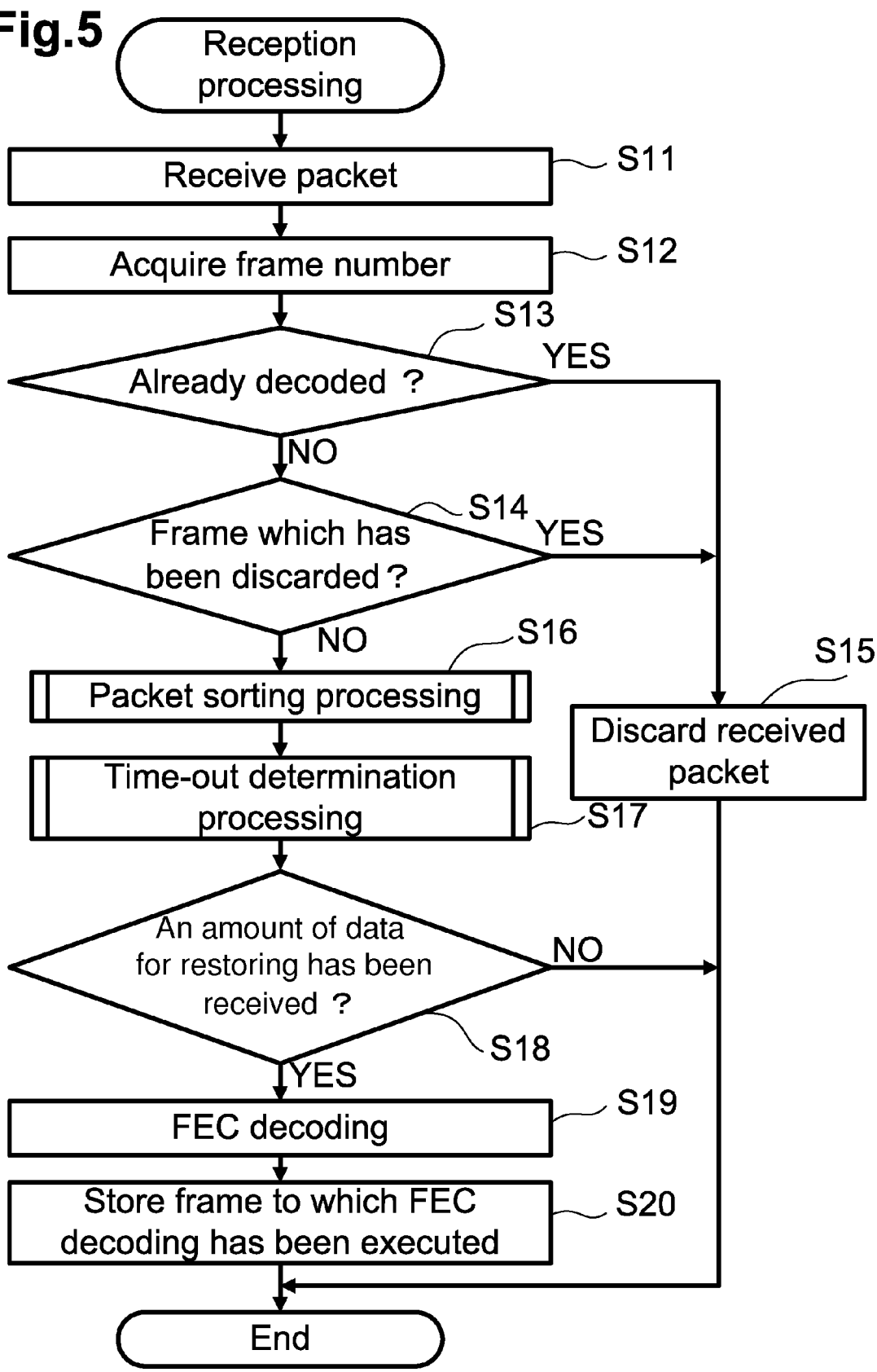

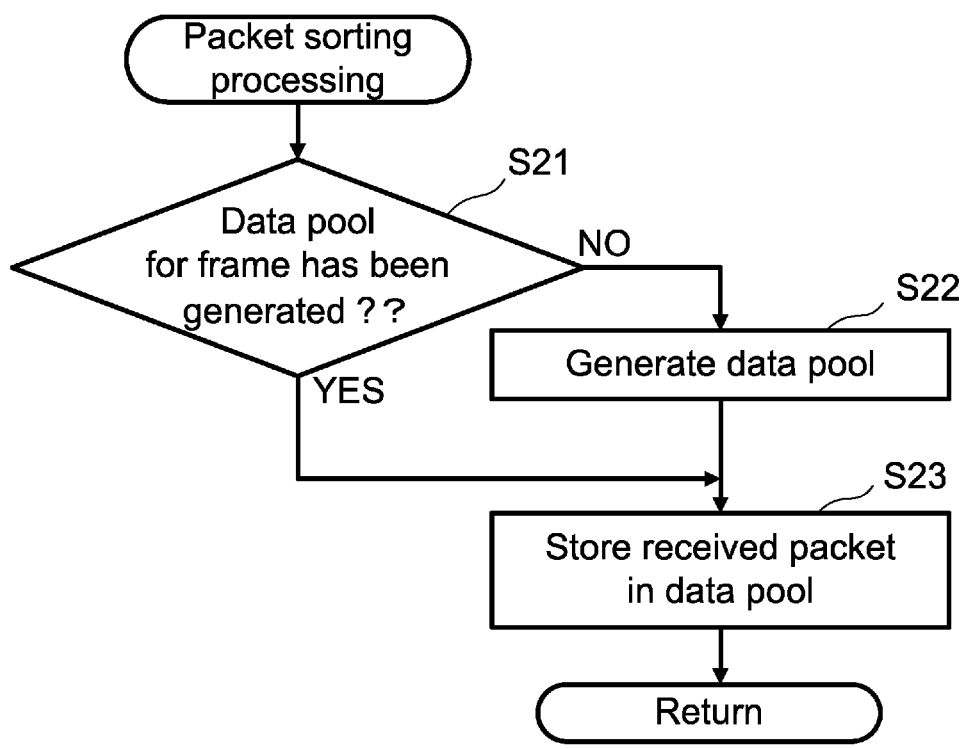

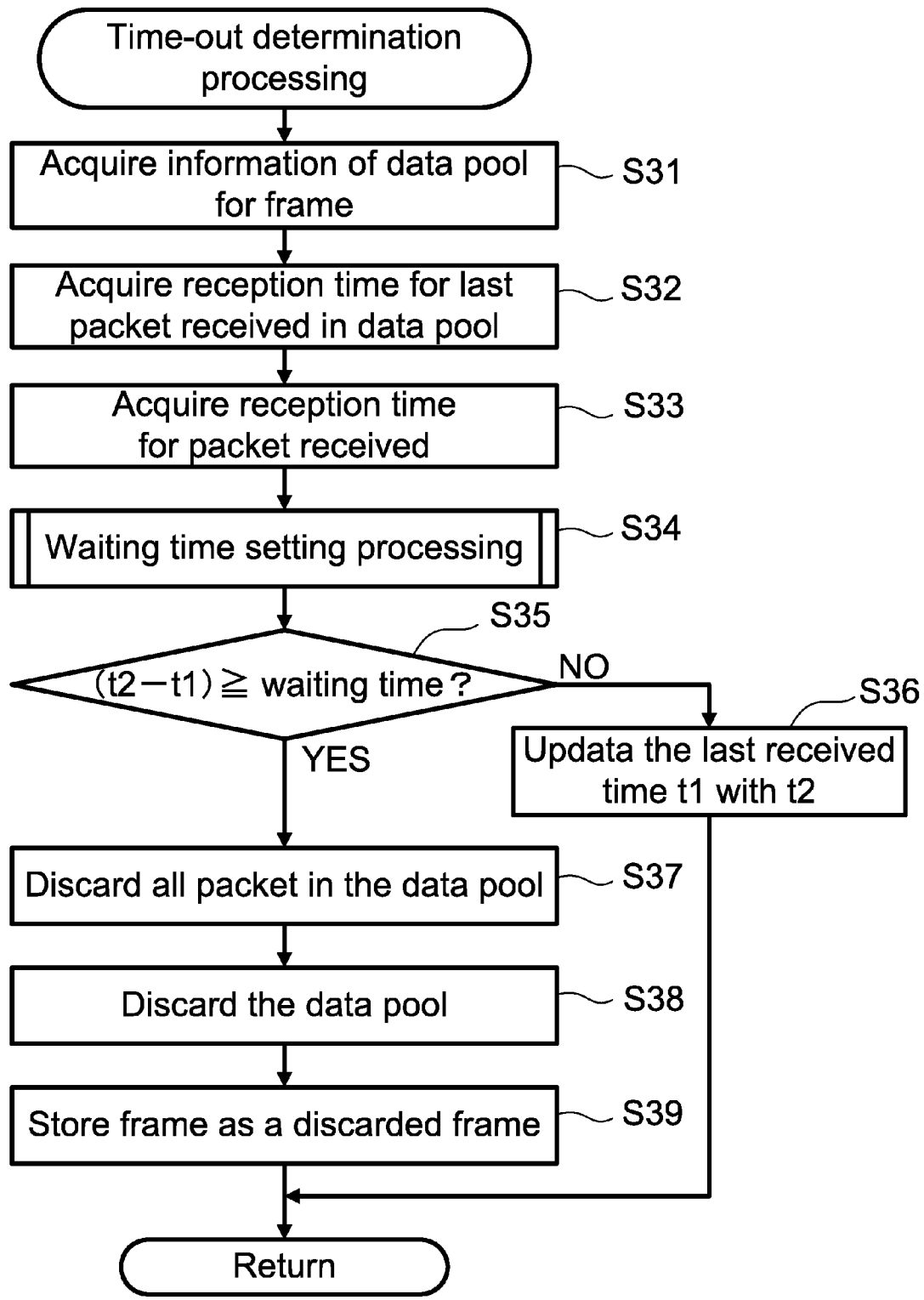

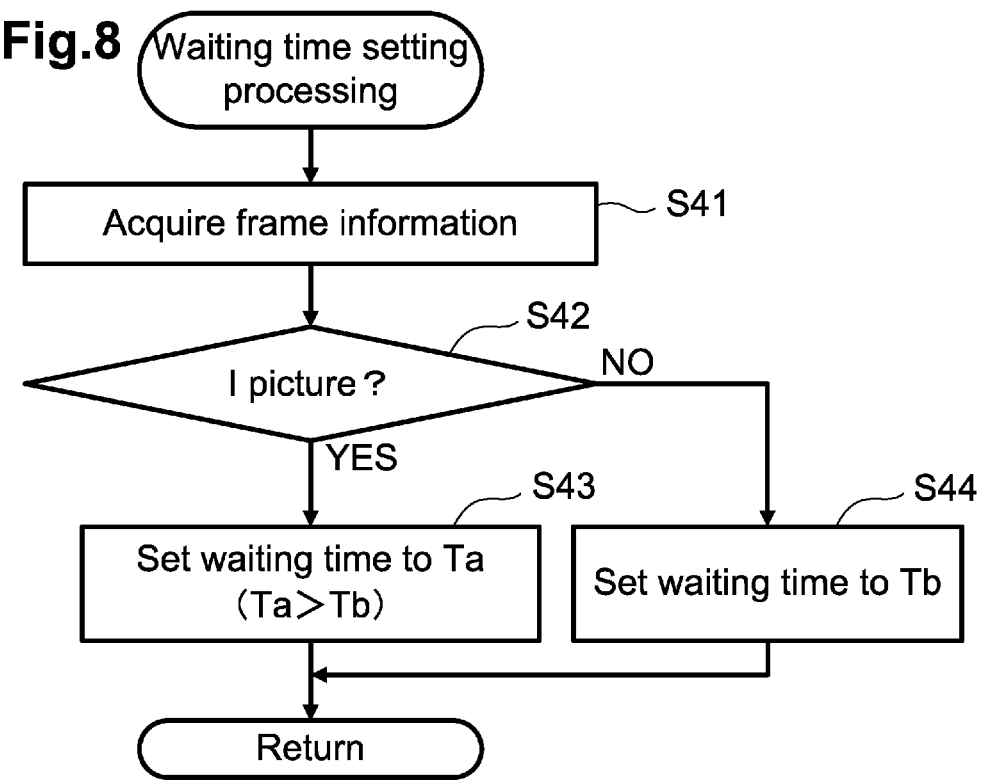

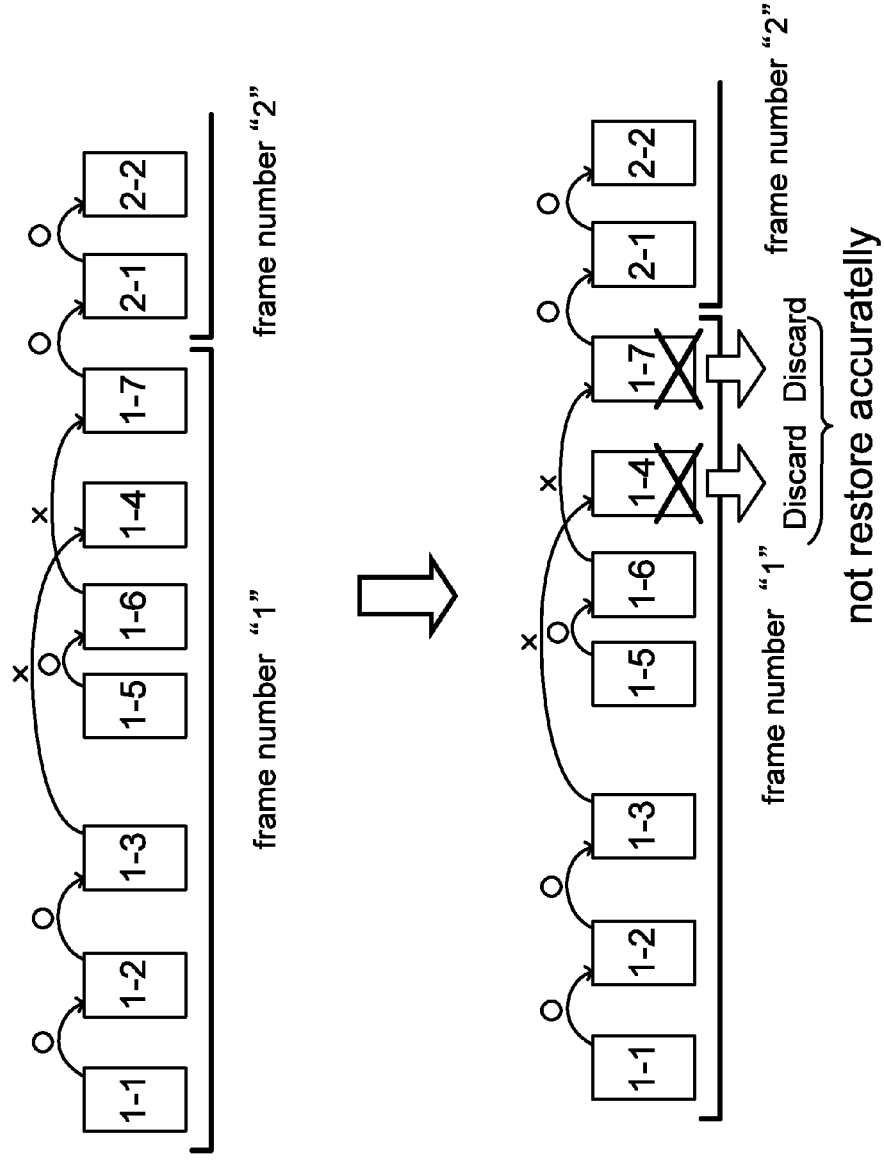
Fig.9 《 Time-out determination according to sequence number 》

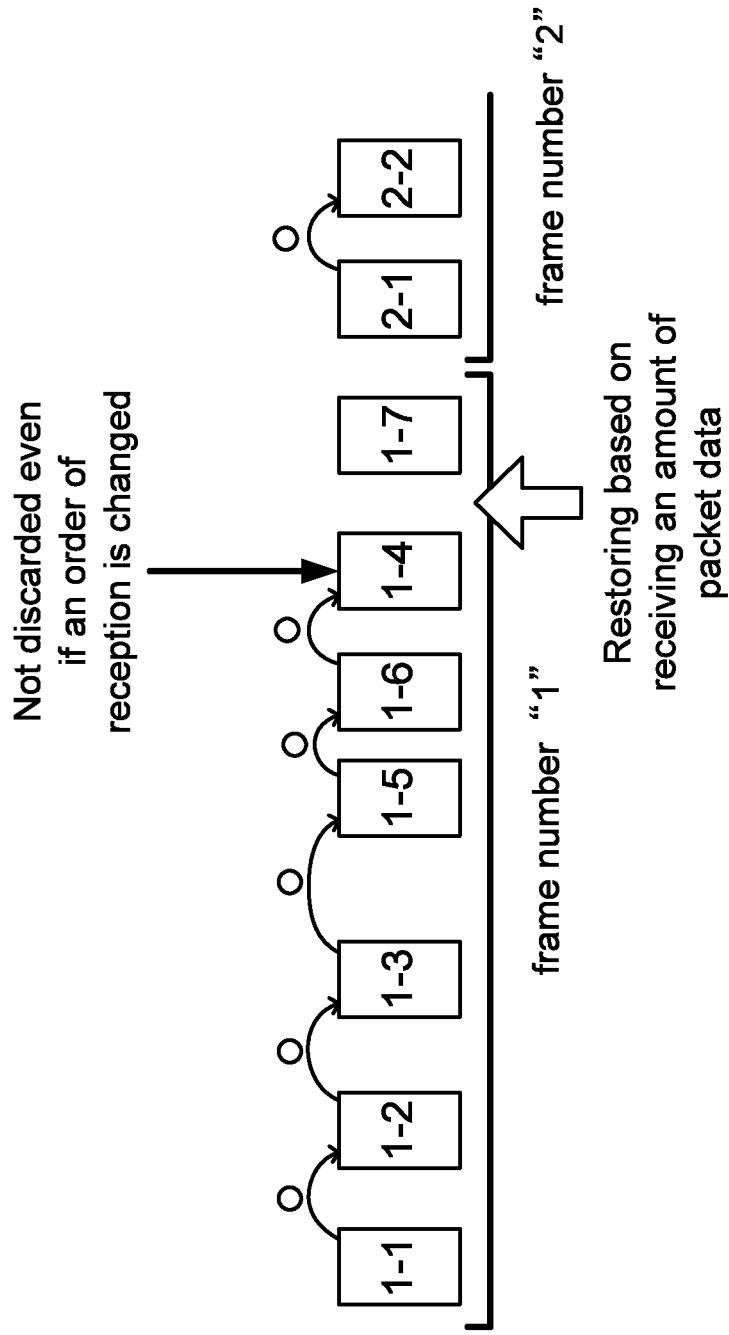

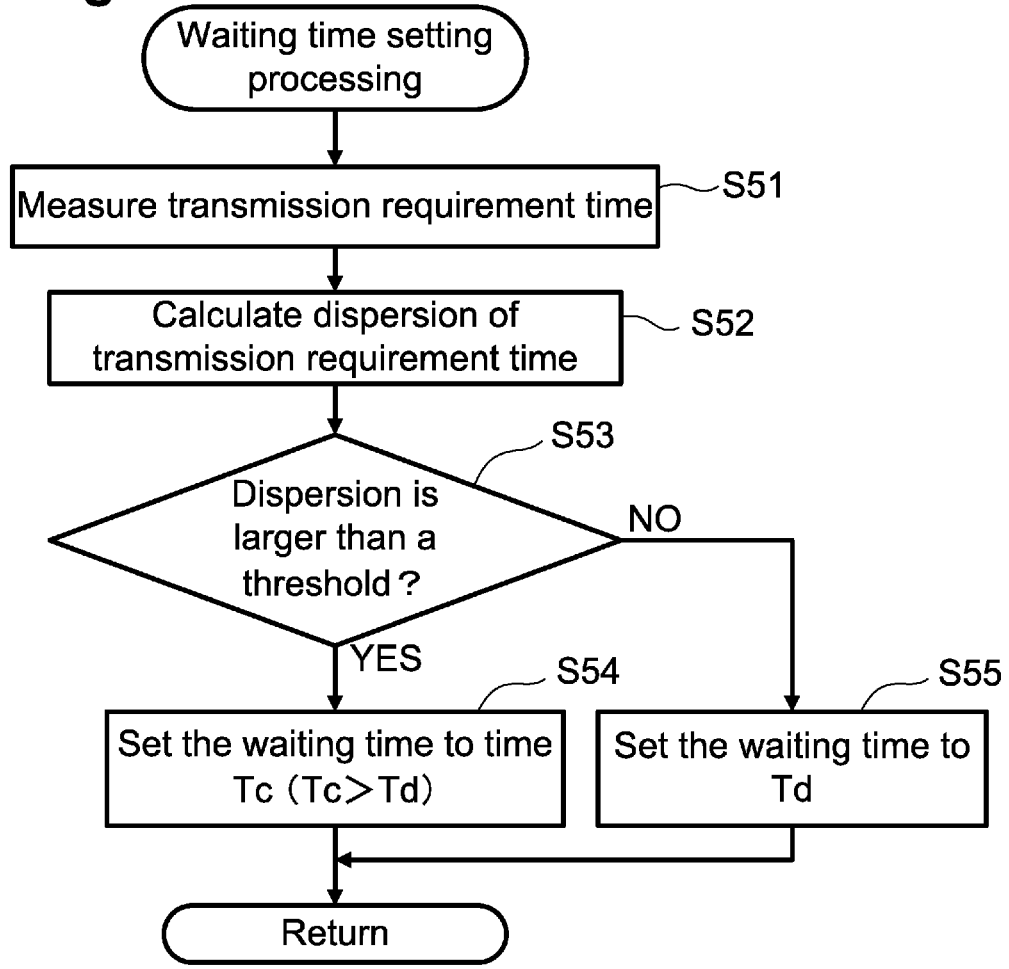

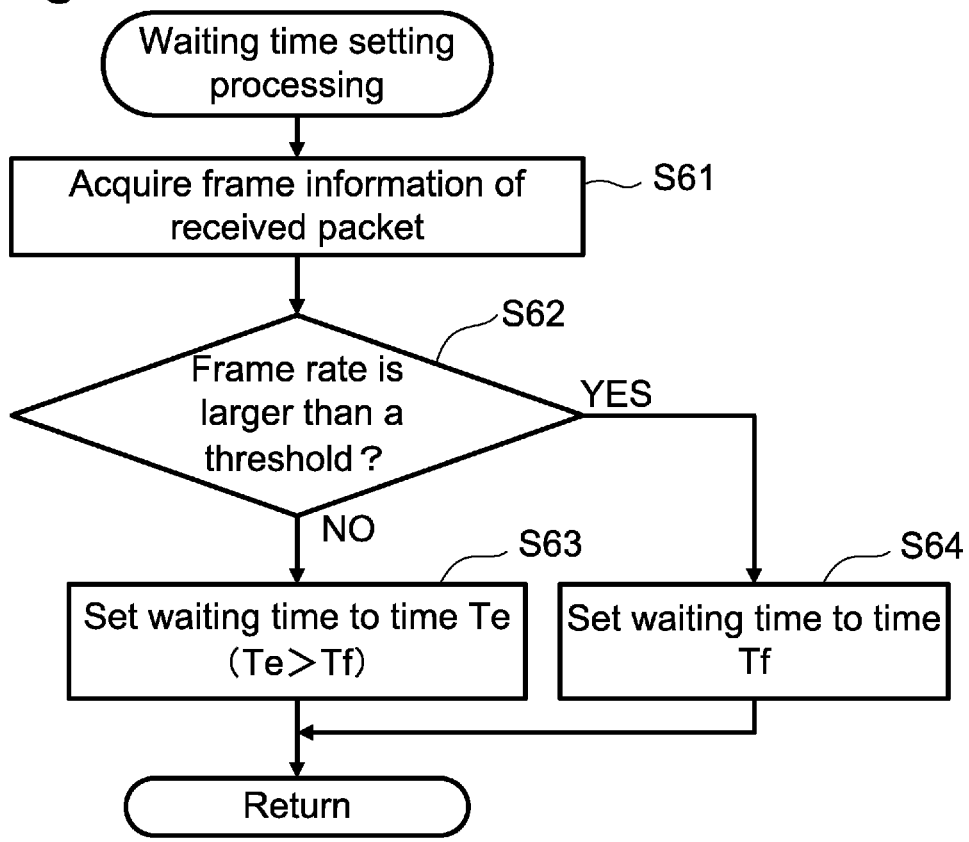

DATA PROCESSING DEVICES, COMPUTER READABLE STORAGE MEDIA, AND METHODS

CROSS-REFERENCE TO RELATED APPLICATION

This application claims priority from Japanese Patent Application No. 2011-145636 filed on Jun. 30, 2011, which is incorporated herein by reference.

BACKGROUND OF THE INVENTION

1. Field of the Invention

This application relates generally to data processing devices that process data received through a network, and data processing methods and computer readable storage media storing instructions for data processing.

2. Related Art

A known method is used for transmitting and receiving various data to and from a plurality of devices. When video data is transmitted and received between devices, a transmitter is provided to sequentially encode, packetize, and transmit video data acquired from a photographic unit to a receiver. A transmitter is a device on the video data transmission side. Further, a receiver is a device on the video data reception side. The receiver receives a data packet through a network and outputs encoded data contained in the received data packet to a decoding unit.

SUMMARY OF THE INVENTION

When a delay due to congestion of the network or a change of a communication path occurs, the order of data packets is changed between the time of transmission and the time of reception between terminals. In addition, a packet loss may occur between terminals. Even if the order of the reception of the packets is changed or a packet loss occurs, it is desirable that the receiver may process data suitably. A known receiver stores received packets in a buffer. When the order of sequence numbers attached to the received packets is changed, the receiver starts a timer. When a packet, for which reception has been delayed, is received before time-out, the receiver outputs the packets stored in the buffer in their order of the sequence numbers. On the other hand, if the time is out before a packet, for which reception has been delayed is received, the receiver outputs only the packets stored in the buffer in the order of the sequence numbers.

The forward error correction (FEC) scheme is a known method for resolving malfunctions in the transmission and reception of packets without retransmitting the packets. With FEC, a transmitter adds redundant data to data in a packet. As a result, the receiver restores the data that failed to be received due to transmission malfunctions or the destruction of a packet, from the redundant data. Thus, FEC allows the time difference from transmission to the completion of reception to be reduced compared with the required for the packet to be retransmitted. Therefore, FEC is used in situations, in which packets are difficult to be retransmitted, such as streaming broadcasting.

When data is transmitted/received by applying FEC, even if the receiver has not received all of the packets belonging to a group of packets, the data contained in the group of packets may be restored if at least a certain amount of the packets has been received. The group of packets are referred as a restoration group. The restoration group represents a group of packets for one frame, a group of packets for one slice, and the like. Thus, data contained in the restoration group is restored smoothly, if the receiver receives at least a certain amount of packets belonging to one restoration group smoothly even if the order of the reception of the packets is changed. Nevertheless, in the known method, even if a plurality of packets belonging to one restoration group are received smoothly, the packet, for which reception has been delayed and timed out, is not output. As a result, more packets than necessary are discarded, and the data is not decoded accurately.

According to an embodiment of the present invention, a data processing device comprising: a controller configured to control the data processing device to execute steps of: receiving a data packet comprising a group identification information that identifies a restoration group, with which the data packet is associated, and redundant data for restoring a lost data packet, which is associated with the restoration group identified by the group identification information; determining whether a received amount of data packet associated with the restoration group identified by the group identification information is equal to or greater than a predetermined value; and restoring the lost data packet associated with the restoration group identified by the group identification information when the received amount of data packet associated with the restoration group identified by the group identification information is equal to or greater than the predetermined value.

According to another embodiment of the present invention, a method for implementing data processing comprising steps of: receiving a data packet comprising a group identification information that identifies a restoration group, with which the data packet is associated, and redundant data for restoring a lost data packet, which is associated with the restoration group identified by the group identification information; determining whether a received amount of data packet associated with the restoration group identified by the group identification information is equal to or greater than a predetermined value; and restoring the lost data packet associated with the restoration group identified by the group identification information when the received amount of data packet associated with the restoration group identified by the group identification information is equal to or greater than the predetermined value.

According to still another embodiment of the present invention, a non-transitory computer readable storage medium storing computer readable instructions that, when executed, cause a data processing device to execute steps of: receiving a data packet comprising a group identification information that identifies a restoration group, with which the data packet is associated, and redundant data for restoring a lost data packet, which is associated with the restoration group identified by the group identification information; determining whether a received amount of data packet associated with the restoration group identified by the group identification information is equal to or greater than a predetermined value; and restoring the lost data packet associated with the restoration group identified by the group identification information when the received amount of data packet associated with the restoration group identified by the group identification information is equal to or greater than the predetermined value.

Other objects, features, and advantages of an embodiment of the invention will be apparent to persons of ordinary skill in the art from the following description of an embodiment with reference to the accompanying drawings.

BRIEF DESCRIPTION OF THE DRAWINGS

For a more complete understanding of the present invention, needs satisfied thereby, and the objects features, and advantages thereof, reference now is made to the following descriptions taken in connection with the accompanying drawings.

FIG. 5 is a flowchart depicting a reception process according to an embodiment of the invention.

FIG. 6 is a flowchart depicting a packet distribution process according to an embodiment of the invention.

FIG. 7 is a flowchart depicting a time-out determination process according to an embodiment of the invention.

FIG. 8 is a flowchart depicting a waiting time setting process according to an embodiment of the invention.

FIG. 9 depicts a process for describing a processing result when a time-out determination is performed according to a sequence number according to an embodiment of the invention.

FIG. 10 depicts a processing result according to an embodiment of the invention.

FIG. 11 is a flowchart depicting a waiting time setting process according to another embodiment of the invention.

FIG. 12 is a flowchart depicting a waiting time setting processing according to still another embodiment of the invention.

DETAILED DESCRIPTION OF EMBODIMENTS OF THE INVENTION

Figure 1:
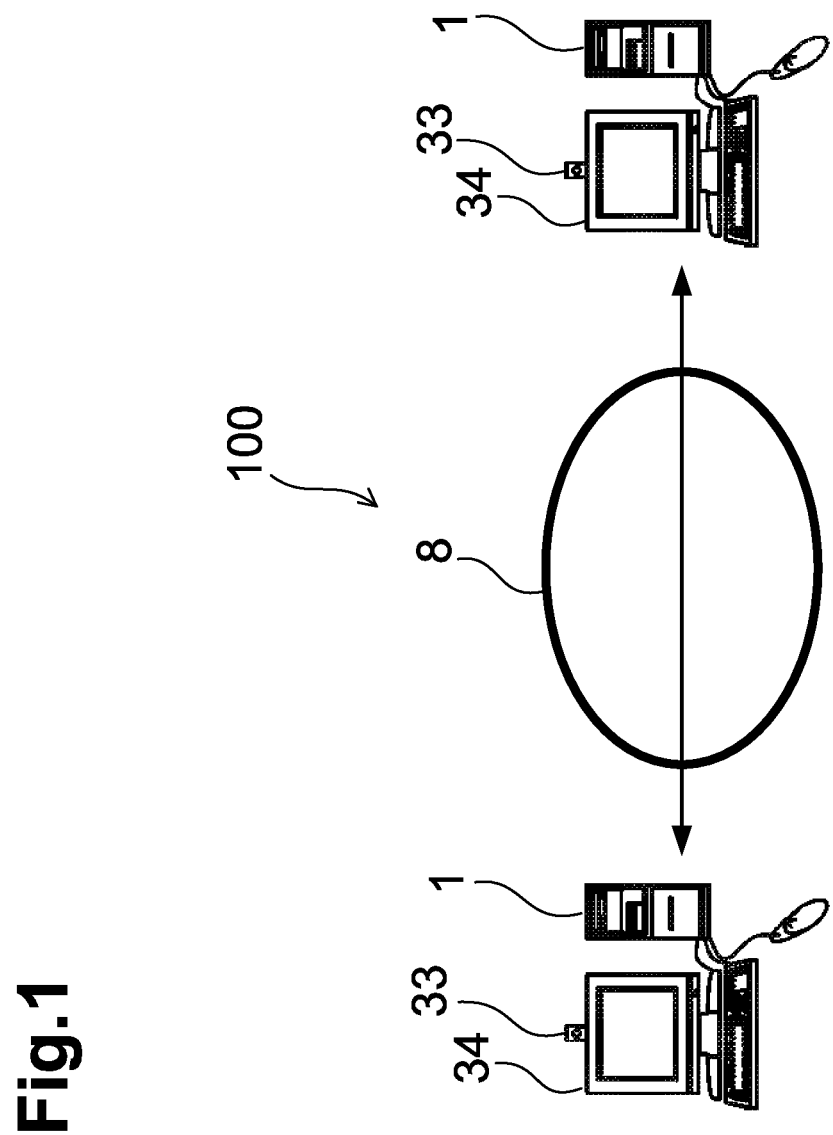
FIG. 1 depicts a system configuration of a communication system 100 according to an embodiment of the invention.

Embodiments of the invention now are described in detail with reference to the accompanying drawings, like reference numerals being used for corresponding parts in the various drawings.

Referring to FIG. 1, a communication system 100 may comprise a plurality of PCs 1, e.g., data processing devices. Each PC 1 may transmit and receive data to or from other PCs 1 through a network 8, e.g., the internet. The communication system 100 may be a server-type communication system in which data may be transmitted and received through a server. Further, the communication system 100 may be a peer-to-peer (P2P) type communication system in which data may be transmitted and received directly to or from respective PCs 1. Respective PCs 1 may be connected to respective base locations.

In another embodiment, the communication system 100 may comprise a plurality of processors, e.g., data processors. A videoconference terminal may be placed in each base location to perform a videoconference. A data processor may be a device that receives data through the network 8, and processes the received data.

Figure 2:
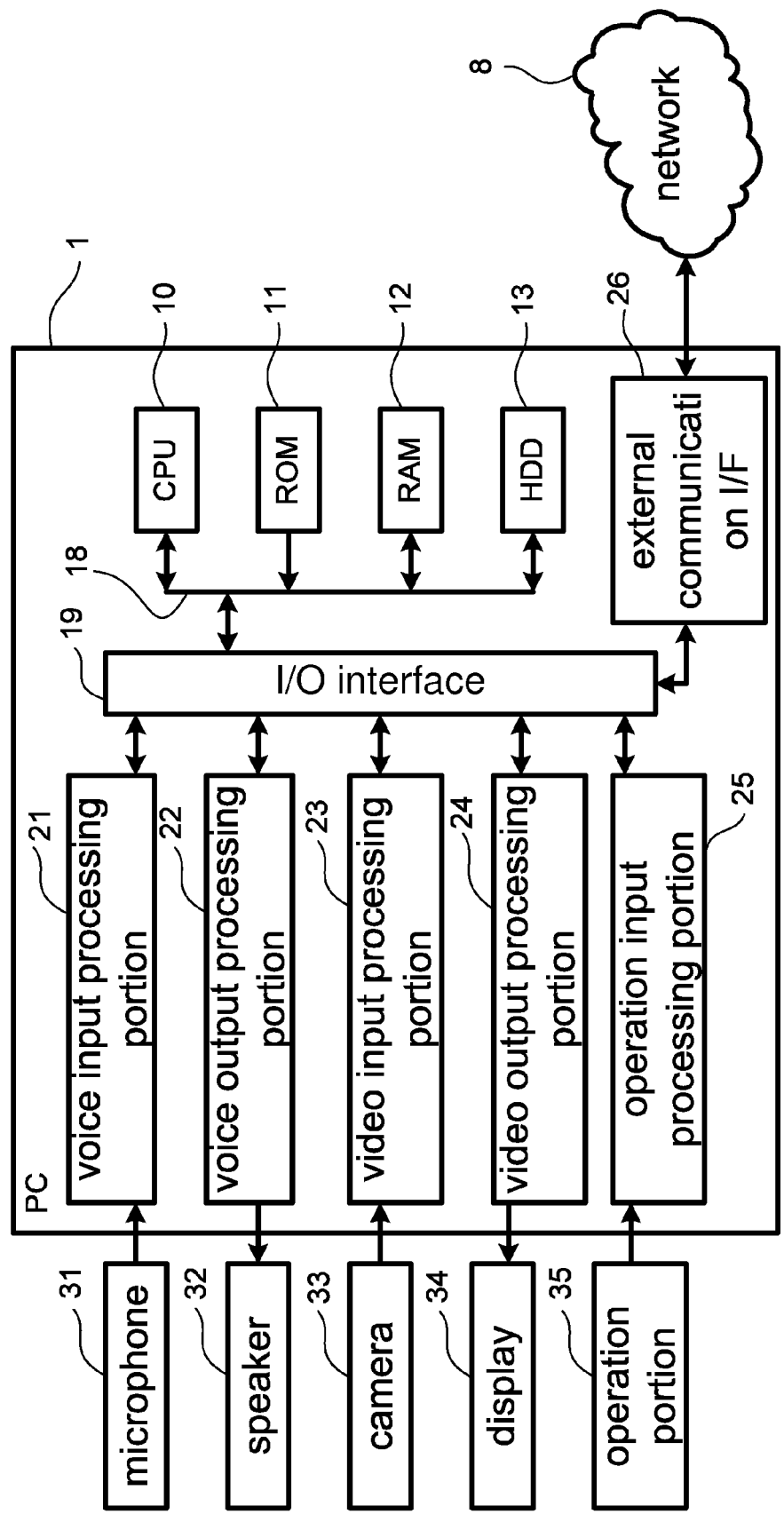
FIG. 2 is depicts an electrical configuration of a person computer (PC) according to an embodiment of the invention.

The communication system 100 of may be a videoconference system for performing a videoconference using audio and video. Each PC 1 may transmit audio data and video data to other PCs 1 in the communication system 100. Audio data may be entered by a microphone 31, as shown in FIG. 2, connected to the base location of the PC 1. Video data may be entered by a camera 33 or other video generating device. Each PC 1 outputs audio from each of other base locations through a speaker 32 based on data received from each of other PCs 1. Further, each PC 1 may display video from each of other base locations on a display 34 based on data received from each of other PCs 1. As a result, the audio and video from plural base locations may be shared in the communication system 100. Furthermore, each PC 1 may transmit and receive data to and from other PCs 1, such as documents, figures, and photographs, or the like, to be viewed during the conference, and a pointer to point out a certain position in a screen of display 34 that is displayed. Users may perform the conference using the communication system 100 even if all of the users are not in the same base location. Each PC 1 in the communication system 100 may packetize, transmit, and receive each data such as audio and/or video materials and a pointer. The PC 1 that transmits data may be to as a "transmitter." The transmitter may acquire video data on a frame basis from the camera 33 at the base location of the transmitter. The transmitter may encode the acquired video data. Thus, the transmitter may generate encoded data. The transmitter then may include one frame of generated encoded data in one or more packets, e.g., packetize, and may transmit them. The one frame of encoded data may be contained in a plurality of packets as a restoration group.

The transmitter may perform image compression encoding on the frame of data acquired from the camera 33. The image compression encoding may include intra-frame coding and inter-frame coding. The intra-frame coding may be a method of using an intra-screen prediction to encode the one frame of data among the several frames of video data shot continuously by the camera 33. An I-picture, e.g., Intra-coded Picture, which is encoded data generated by the intra-frame coding may be decoded independently without making reference to other frames. On the other hand, the inter-frame coding may be a method of encoding a prediction error. The prediction error may be calculated with reference to a frame data among the consecutive plural frames of data that differs from the frame of data to be encoded. The encoded data generated by the inter-frame coding may include a Predictive-coded Picture (P-picture) and a Bidirectional-coded Picture (B-picture). The frame, to which reference is made during encoding, may be required to decode the P-picture and B-picture accurately. Nevertheless, the amount of data of the P-picture and the B-picture may be less than that of the I-picture which may be decoded independently. The transmitter may transmit video data efficiently by performing image compression encoding.

The transmitter may perform encoding by FEC. Specifically, for FEC encoding, the transmitter may include redundant data in each packet. The redundant data may be used to detect and restore a data error. A receiving device may be referred to as a "receiver." When the receiver completes the reception of a certain amount of data contained in the restoration unit, the receiver may use the received data to restore lost packets through the restoration unit. The certain amount of data received may include image compression encoding data and redundant data of the video. Therefore, even if the order of receiving packets and the order of transmitting packets are different and a packet loss occurs, the receiver may restore a lost packet and process data properly. The receiver may not need to request for the retransmission of the lost packet from the transmitter. Therefore, the data such as video may be played in real time. Particularly, the receiver may execute processing of data generated or transmitted by FEC encoding without wasting a packet necessary for decoding. There are various modes for FEC, such as Reed-Solomon codes, turbo codes, or low-density parity-check (LDPC) codes. As FEC, one or more of Reed-Solomon codes, turbo codes or low-density parity-check (LDPC) codes may be used.

Referring to FIG. 2, the PC 1 may include a central processing unit (CPU) 10, e.g., controller, that controls the PC 1. A read-only memory (ROM) 11, a random-access memory (RAM) 12, a hard disk drive (HDD) 13, and an input/output (I/O) interface 19 may be connected to the CPU 10 through a bus 18. The CPU 10 and storage devices, including the ROM 11, the RAM 12, and the HDD 13, may constitute the computer PC 1. The computer PC 1 also may perform timing action.

Figure 3:
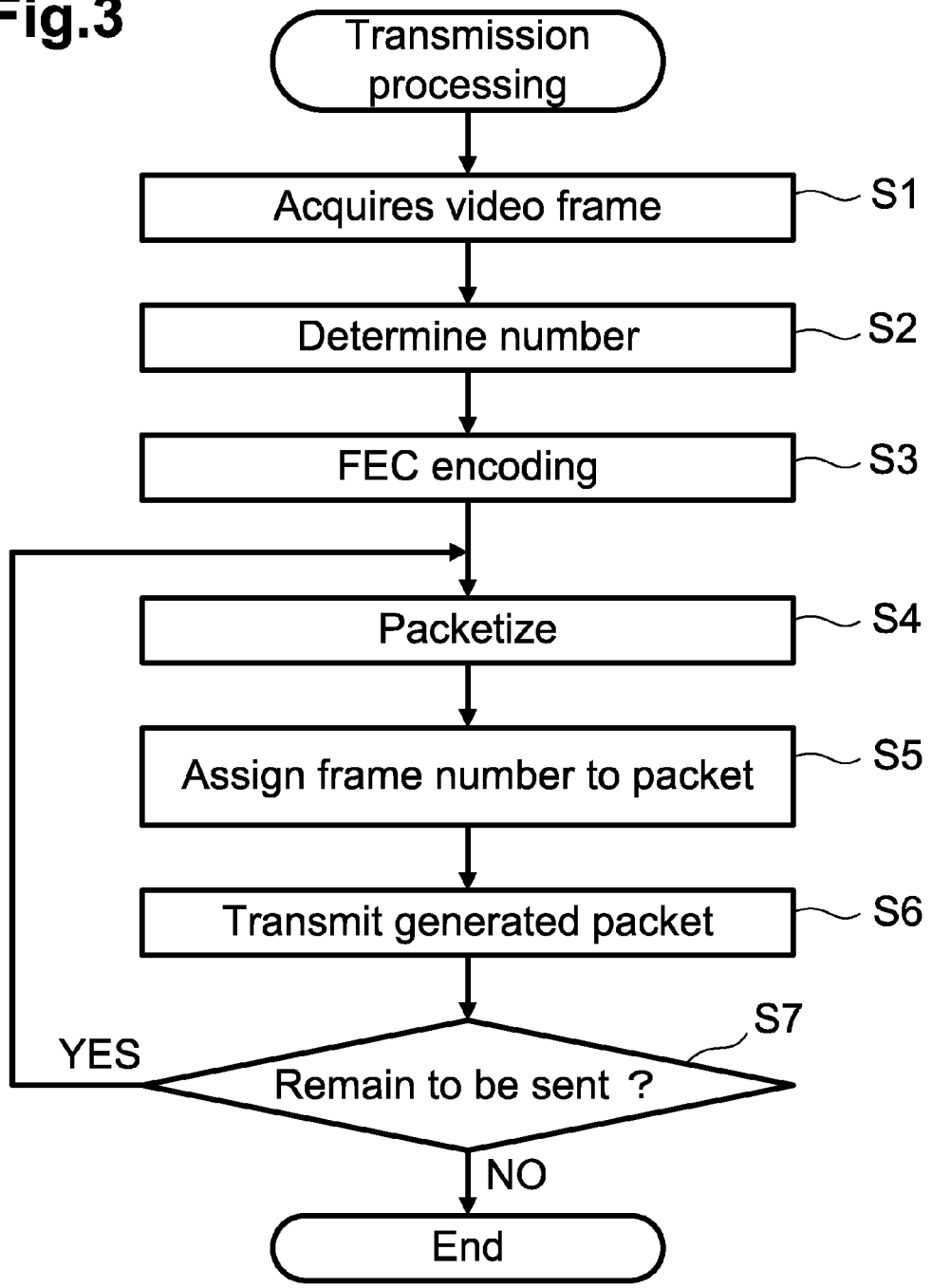
FIG. 3 is a flowchart depicting a transmission process according to an embodiment of the invention.

The ROM 11 may store a program for operating the PC 1 and an initial value and the like. The RAM 12 temporarily may store various types of information on a received packet and the like. The HDD 13 may be a nonvolatile storage device storing various types of information, e.g., control programs. Specifically, the HDD 13 may store a data processing program for performing transmission process, as shown in FIG. 3, and reception process, as shown in FIG. 5. In another embodiment, other nonvolatile memories, e.g., an electrically erasable programmable read-only memory (EEPROM), may be used. The data process program may be downloaded from a predetermined server through the network 8 and stored in the HDD 13.

A voice input processing portion 21, a voice output processing portion 22, a video input processing portion 23, a video output processing portion 24, an operation input processing portion 25, and an external communication I/F 26 may be connected to an I/O interface 19. The audio input processing portion 21 may process the input of audio data from a microphone 31 through which audio is entered. The microphone 31 may be electrically connected to the voice input processing portion 21. The audio output processing portion 22 may process the operation of a speaker 32 through which voice may be outputted. The speaker 32 may be electrically connected to the voice processing portion 22. The video input processing portion 23 may process the input of the video data from the camera 33 shooting video. The video input processing portion 23 may be electrically connected to the camera 33. The video output processing portion 24 may process the operation of the display 34 displaying video. The video output processing portion 24 may be electrically connected to the display 34. The operation input processing portion 25 may process data input from an operation portion 35, e.g., a keyboard and a mouse. The operation portion 35 may be electrically connected to the operation input processing portion 25. The external communication I/F 26 may connect the PC 1 to the network 8.

The CPU 10 of the PC 1 may perform the transmission process, as shown in FIG. 3 and reception process, as shown in FIG. 5, according to the data processing program stored in the HDD 13. The CPU 10 may perform transmission process and reception process concurrently or independently.

Referring to FIG. 3, the CPU 10 of the PC 1 may perform transmission processing each time when one video frame is acquired from the camera 33 connected thereto. First, the CPU 10 may acquire a video frame entered from the camera 33 at step S1. In step S1, the CPU 10 may acquire a picture frame of a moving picture. At step S2, the CPU 10 may determine a number assigned to the frame in order to identify the order of the acquired frame. Specifically, the CPU 10 may allocate a frame number to the acquired frame. At step S3, the CPU 10 may perform FEC encoding on the acquired frame. More specifically, in step S3, the CPU 10 may perform image compression encoding on the acquired frame. The CPU 10 then may generate an I-picture, a P-picture, or a B-picture. Furthermore, the CPU 10 may generate redundant data. The redundant data may be used to restore the generated image compression encoded data.

At step S4, the CPU 10 may packetize, e.g., generate packets from, a certain amount of the encoded data generated by FEC encoding and the redundant data. At step S5, the CPU 10 then may assign the frame number, which is obtained in step S2, to the header of the generated packet.

Figure 4:
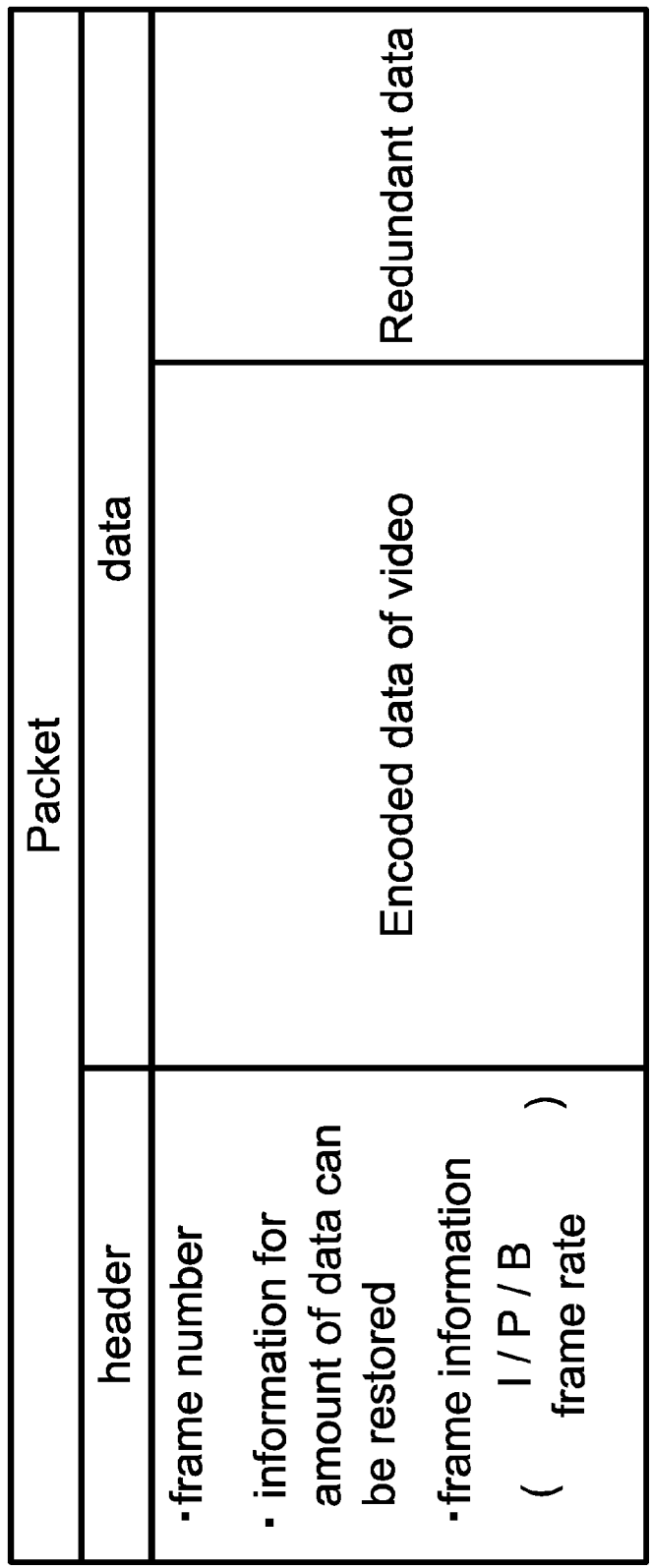
FIG. 4 depicts a data configuration of a packet transmitted by a transmission process according to an embodiment of the invention

FIG. 4 may depict an example of the data configuration of the generated packet. The header portion of the packet may include a frame number, e.g., group information data, information concerning the amount of data that can be restored, and frame information, e.g., frame type, frame rate, or the like. Information concerning the amount of data that can be restored is information indicating an amount of data that is required for restoring a lost packet per one data frame. Specifically, the information for the amount of data that can be restored may be information indicating an amount of data of the encoded data and the redundant data. The frame information may be information on a frame constituted by the encoded data contained in the packet. The frame information may include information indicating a frame type, e.g., I picture, P picture, or B picture, and information indicating a frame rate. When a packet is generated in step S4, information for the amount of data that can be restored and the frame information may be added to the header of each packet. The data portion of the packet may comprise encoded data of the video and redundant data used to restore a lost packet.

Referring to FIG. 3, when the CPU 10 generates a packet, the CPU 10 may transmit the generated packet to the receiver at step S6. At step S7, the CPU 10 may determine whether there is unsent data among data generated by FEC encoding in step S3. If there is unsent data, e.g., YES in step S7, the processing may return to step S4, and the data remains to be sent in one frame may be transmitted by a plurality of packets in steps S4 to S6. When there is no unsent data, e.g., No in step S7, the transmission processing may end. When the data of the next frame is acquired from the camera 33, the transmission processing may be performed again. In this manner, the transmitter may perform FEC encoding on a frame basis. The transmitter then may transmit the generated one frame data to the receiver in one or more packets. Therefore, when a lost packet is restored using the redundant data, the receiver may perform restoration processing on a frame basis. The restoration processing may use FEC decoding. A group of packets, which is to be a unit for restoring lost packets, may be one or more packets of one frame data. The group of packets, which is to be a unit restoring lost packets, may be referred to as a "restoration group." Referring to FIGS. 5-8, the CPU 10 of the PC 1 may perform reception process each time one packet is received from another PC 1, e.g., the transmitter, in the communication system 100. Reception process may be performed by the CPU 10 of the receiver. First, the CPU 10 may receive a packet through the network 8 at step S11. At step S12, the CPU 10 may make reference to the header of the received packet and may acquire the number of the frame constituted by the data in the packet.

At step S13, the CPU 10 may determine whether the received packet is a packet of a frame which has already been decoded by using the frame number acquired in step S12. The CPU 10 may store the frame which has been decoded in the RAM 12 in step S20. If the received packet is a packet of a frame which has already been decoded, e.g., YES in step S13, the CPU 10 may discard the received packet at step S15, and the process may end.

If the packet is not a packet of a frame which has already been decoded, e.g., NO in step S13, the CPU 10 may determine whether the received packet is the packet for a frame which has been discarded at step S14. If the CPU 10 does not receive packets constituting the frame smoothly, and does not acquire within a predetermined time a certain amount of data by which the lost packet can be restored, the CPU 10 may discard all of the received data associated with the frame. As a result, the CPU 10 may process the next frame quickly. When the CPU 10 receives a packet for a frame which has been already discarded, e.g., YES in step S14, the CPU 10 may discard the received packet at step S15, and the process may end. If the received packet is not a packet for a frame which has been already discarded, e.g., No in step S14, the CPU 10 may perform packet sorting process at step S16 and time-out determination process at step S17.

Referring to FIG. 6, in the packet sorting processing, the CPU 10 may generate a data pool for each frame. The CPU 10 then may store a received packet in each data pool. At step S21, the CPU 10 may determine whether the data pool for the frame, to which a received packet belongs, has been already generated. If a data pool has not been generated yet, e.g., NO in step S21, the CPU 10 may generate a data pool for the frame to which the received packet belongs in a storage area of the RAM 12 at step S22. At step S23, the CPU 10 then may store the received packet in the generated data pool. The CPU 10 then may return to reception process. On the other hand, if a data pool has been already generated, e.g., YES in step S21, the CPU 10 may add a packet to the data pool for the frame to which the received packet belongs at step S23. Specifically, in step S23, the packet received in step S11 and the reception time indicating the time when the packet is received in step S11 may be associated with each other and stored in the data pool. The reception time may be information indicating the time when the packet is received. Further, the reception time may include information indicating the time and date when the packet is received in addition to the reception time. The CPU 10 then may return to reception processing in FIG. 5. When the packet distribution process at step S16 is finished, the CPU 10 may perform the time-out determination process at step S17.

Referring to FIG. 7, the time-out determination process may determine whether packet reception interval is equal to or greater than waiting time. The waiting time may be a time from when a first packet among plural packets constituting one frame has been received to when the following second packet is received. If the receiver waits for reception of the packet for an extended time, video may not be played in real time. The video on the receiver may freeze in video conferencing. Therefore, the receiver may process a next frame when the receiver has waited for the reception of the packet for a predetermined time. Nevertheless, if the waiting time for the reception of the packet is insignificant, video may be played without a sufficient amount of data being received, and the quality of video may be reduced. Therefore, in the time-out determination process, a sufficient waiting time may be set based on frame information. When the reception interval becomes equal to or greater than the set waiting time, the packets of the frame which reception has been delayed may be discarded.

First, the CPU 10 may acquire information of the data pool for the frame to which a received packet belongs, at step S31. At step S32, the CPU 10 may acquire the reception time for the last packet received among the packets stored in the data pool. In the data pool, the reception time for the last packet received may be referred to as the last reception time t1. At step S33, the CPU 10 may acquire the reception time t2 for the packet received in step S11 of FIG. 5. Then, the CPU 10 may perform waiting time setting process at step S34.

As shown in FIG. 8, when the CPU 10 starts the waiting time setting process, the CPU 10 may acquire frame information from the header of the received packet at step S41. The frame information may include information indicating the type of the frame to which the packet belongs. The CPU 10 may determine whether the type of the frame to which the received packet belongs is an I-picture at step S42. If the CPU 10 determines that the type of frame is the I-picture, e.g., YES in step S42, the CPU 10 may set the waiting time to Ta longer than Tb at step S43, and may return to the time-out determination processing. When the P-picture and the B-picture are decoded, I-picture may be referred. Therefore, if the I-picture is not decoded accurately, the quality of the P-picture and the B-picture may decrease. The receiver may prevent a quality of the P-picture and the B-picture as well as the I-picture from adverse effects by extending the waiting time when the packet of the I-picture is received. If the type of the frame is the P picture or the B picture, the type of the frame may not be the I picture, e.g., NO in step S42, the CPU 10 may set the waiting time to Tb less than Ta at step S44, and may return to the time-out determination process.

Referring to FIG. 7, when the CPU 10 finishes the waiting time setting process at step S34, the CPU 10 may determine whether "t2−t1" is equal to or greater than the waiting time at step S35. "t2−t1" may indicate the reception interval. "t2−t1" may indicate non-reception time. When "t2−t1" is not equal to or greater than the waiting time, the packets associated with the same frame may be received smoothly. If the reception interval is less than the waiting time, in other words, the packets associated with the same frame are being received smoothly, e.g., NO in step S35, process, such as the discard of packets, may not be performed. In this case, the CPU 10 may update the last received time t1 with t2 in the packet in the data pool at step S36 and may return to the reception process.

If the reception interval "t2−t1" is equal to or greater than the waiting time, e.g., YES in step S35, the CPU 10 may discard all packets stored in the data pool for the frame to which the received packet belongs at step S37. Further, the CPU 10 may also discard the data pool at S38. The CPU 10 may avoid the FEC decoding of the frame which reception interval has become equal to or greater than the waiting time, and may process a next frame. The CPU 10 may store the frame, which have been discarded, as a discarded frame in the RAM 12 at step S39. The CPU 10 then may return to the reception process.

Referring to FIG. 5, when the time-out determination processing at step S17 is finished, the CPU 10 may determine whether an amount of data, by which the lost packet can be restored, has been already received at step S18. As described above, the information for the amount of data whereby the lost packet can be restored may be included in the header of each packet, as shown in FIG. 4. If the amount of data, by which the lost packet can be restored, has not been stored yet in the data pool for the frame to which the received packet belongs, or if the data pool has been discarded, e.g., NO at step S18, the CPU 10 may end the reception process. If the amount of data, by which the lost packet can be restored, already has been stored in the data pool, e.g., YES in step S18, the CPU 10 may perform FEC decoding on the packet stored in the data pool at step S19. The CPU 10 may store the frame, to which FEC decoding has been executed, as a decoded frame at step S20. The CPU 10 then may end the reception process. Thus, in response to the completion of the reception of such an amount of data, by which the lost packet can be restored, the CPU 10 may use the redundant data contained in the received data to restore the packet which has not been received yet as a lost packet. When the CPU 10 receives the amount of data, by which the lost packet can be restored, FEC decoding may be executed regardless of whether or not the remaining packets are received. Therefore, the process may be executed quickly. The CPU 10 may execute the processing of steps S19 and S20 in the order of the frame numbers, such that the order of the frames to be decoded may be preserved. Thus, if there is a frame to which decoding is not executed and which data have not been discarded before a frame subjected to the processing of steps S19 and S20, the CPU 10 may queue the processing of steps S19 and S20.

FIG. 9 depicts a result of a conventional process in which a time-out determination is executed according to a sequence number. The conventional receiver may refer to the sequence number indicating an order of transmission of each packet. The receiver then may measure a time from the reception of a first packet to the reception of a second packet having a next sequence number of the first packet. When the time-out determination is executed according to the sequence number, even if packets belonging to one frame have been received smoothly, sometimes time-out may be determined. As shown in FIG. 9, the reception intervals of a plurality of packets "1-1" to "1-7" having the frame number "1" may be within a predetermined time. Nevertheless, the order of the reception of the fourth packet "1-4" having the frame number "1" may be later than those of the packets "1-5" and "1-6." Thus, in the frame number "1," the reception orders of the packets "1-5" and "1-6" may be swapped with the reception order of the fourth packet "1-4." As a result, the time, from when the packet "1-3" is received to when the packet "1-4" is received, is a greater amount of time than the waiting time that may be required. It may take time equal to or greater than the waiting time from reception time of the packet "1-3" to reception time of the packet "1-4" shown in FIG. 9, and the packet "1-4" may be discarded in the conventional process. Further, the packet "1-7" is received after the packet "1-4" is received. It may take time equal to or greater than the waiting time from the reception time of the packets "1-7" to the reception time of the packet "1-6" (marked with "X" in the FIG. 9). A sequence number of the packet "1-6" may be less than that of the packet "1-7." Consequently, the packet "1-7" also may be discarded. As a result of discarding of the two packets, the frame having the frame number "1" may not be decoded accurately.

Referring to FIG. 10, according to an embodiment of the invention, the PC 1 may execute a time-out determination based on the reception interval between packets belonging to the one restoration group or non-reception time. The restoration group may correspond to one frame according to this embodiment. As shown in FIG. 10, the reception order of the packet "1-4" may be later than the packets "1-5" and "1-6." In this case, if the reception interval between the packet "1-4" and the packet "1-6" is within the waiting time, the packet "1-4" may not be discarded. Further, if the reception interval between the packet "1-4" and the packet "1-6" is within the waiting time, the packet "1-4" is not left without being decoded. Thus, if the reception interval between the packets belonging to the one restoration group is within the waiting time, there may be no adverse effect even if the reception order is changed. On the other hand, if the reception interval of packets belonging to the one restoration group is equal to or greater than the waiting time, the FEC decoding of the data contained in the restoration group is avoided, which is not shown. Thus, other processing is executed quickly. Therefore, even if an error of the reception order of a packet to which FEC is applied or a packet loss occurs to the packet to which FEC is applied, the PC 1 may process data efficiently without wasting the packet required for decoding.

FIG. 10 depicts an example in which, when the packet "1-4" is received, at least a certain amount of data, by which the lost packet for the frame number "1" may be restored has been received. At the time when the PC 1 receives at least a certain amount of data whereby the lost packet can be restored, FEC decoding may be executed regardless of whether all of the packets belonging to the restoration group, e.g., frames having the frame number "1," have been received. As a result, the packet "1-7" may be restored as a lost packet before the packet "1-7" is received, and the frame having the frame number "1" may be decoded accurately. When a packet loss occurs, the PC 1 may wait until at least a certain amount of data is received, thus the lost packet may be restored.

Further, the receiver of may set the waiting time according to the frame information contained in a received packet, as shown in FIG. 8. Therefore, the receiver may set the waiting time to an appropriate length so as to execute processing efficiently. More specifically, the receiver may set the waiting time of the packet of the I-picture for a greater time than that of the P picture and the B-picture. Thus, the receiver may prevent the quality of the P-picture and the B-picture as well as the I-picture from being adversely affected.

Referring to FIG. 11, in another embodiment of the invention, when the CPU 10 starts the waiting time setting processing, the CPU 10 may measure the transmission requirement time at step S51. The transmission requirement time may indicate the time taken from when the received packet has been transmitted to when the packet has been received. An identifier indicating the transmission time of the packet may be added to the header of the packet. The CPU 10 may calculate the difference between the time indicated by the identifier and the reception time. Based on calculated time difference, the CPU 10 may measure the transmission requirement time.

The CPU 10 may calculate a dispersion of the transmission requirement time based on the measurement results of plural transmission requirement time at step S52. The dispersion may represent variability or deviation or jitter. More specifically, the CPU 10 may calculate a standard deviation over a predetermined number of transmission requirement time as dispersion. The CPU 10 then may determine whether the calculated dispersion is greater than a threshold at step S53. When the CPU 10 determines that the dispersion is greater than the threshold, e.g., YES in step S53, the CPU 10 may set the waiting time to time Tc, which is greater than time Td at S54. The CPU 10 then may return to the time-out determination process in FIG. 7. When the dispersion of the transmission requirement time is significant, if a reduced waiting time is set, time-out may occur before sufficient packets are received, and the quality of video may decrease. When the dispersion of the transmission requirement time is greater than the threshold, the CPU 10 may set a greater waiting time. Thus, the efficiency of the processing of the PC 1 may be improved while preventing deterioration of the quality of the video. When the CPU 10 determines that the dispersion is equal to or less than the threshold, e.g., NO at step S53, the CPU 10 may set the waiting time to Td less than Tc at step S55. The CPU 10 then may return to the time-out determination process. Thus, when the dispersion is small, the processing of the PC1 may be executed quickly.

As shown in FIG. 12, in still another embodiment of the invention, when the CPU 10 starts the waiting time setting process, the CPU 10 may acquire frame information from the header of the received packet at step S61. As described above, the frame information may include the frame rate information. The CPU 10 may determine whether the frame rate is greater than a threshold at step S62. If the frame rate is reduced, the interval for displaying frames may increase. Therefore, even if the waiting time is set to be significant, there may be a reduced effect. If the frame rate is significant, the interval for displaying frames may be reduced. Therefore, the frame may not be displayed smoothly if the waiting time is set to be long. Therefore, if the frame rate is equal to or less than the threshold, e.g., NO in step S62, the CPU 10 may set the waiting time to time Te, which is the greater than time Tf, at step S63. The CPU 10 then may return to the time-out determination process. On the other hand, if the frame rate is greater than the threshold, e.g., YES in step S62, the CPU 10 may set the waiting time to the time Tf less than Te at step S64. The CPU 10 then may return to the time-out determination process. In this manner, the PC 1 may set an appropriate waiting time depending on the frame rate.

The PC 1 may packetize the data such as audio, video, materials, and a pointer and transmit and receive it. The PC 1 may execute the process when video data is transmitted and received and when other data, such as audio, materials, and a pointer, is received.

The PC 1 of may execute processes, such as FEC encoding, time-out determination and FEC decoding for a group of packets represent the one frame, as the restoration group. The restoration group may not be set by each frame. For example, one frame may be divided into plural slices. Thus, the restoration group may be set by each slice. a plurality of frames may be set as the restoration group. When the material data are executed, the restoration group may be set by file unit, page unit, or the like.

The PC 1 may execute both of the transmission process in FIG. 3 and the reception process in FIG. 5. Therefore, the PC 1 in the communication system 100 may transmit and receive data concurrently. In another embodiment, a data processor may execute reception process without executing the data transmission.

The PC 1 may avoid FEC decoding by discarding all the packets of a frame that timed out. In this manner, the PC 1 may improve the efficiency of the process, as shown in steps S37-S39 in FIG. 7. In another embodiment, a packet may be stored and left in the memory without executing FEC decoding. FEC decoding may be avoided by storing the packet in the memory. In this case, the packet stored in the memory may be discarded after completing the above-mentioned process. The packet stored in the memory may be discarded periodically.

The time-out determination process may be executed upon receiving a packet. Therefore, when a packet is lost in the network 8 and time is out, the data pool of the frame, to which the lost packet belonged, may be discarded in the process. In another embodiment, the PC 1 may execute the time-out determination processing continuously or periodically. In this case, in response to determining that the reception interval or non-reception time of the packet belonging to the one frame becomes equal to or greater than the waiting time, the PC 1 may discard the data pool within the process of the time-out determination.

While the invention has been described in connection with various exemplary structures and illustrative embodiments, it will be understood by those skilled in the art that other variations and modifications of the structures, configurations, and embodiments described above may be made without departing from the scope of the invention. For example, this application may comprise many possible combinations of the various elements and features disclosed herein, and the particular elements and features presented in the claims and disclosed above may be combined with each other in other ways within the scope of the application, such that the application should be recognized as also directed to other embodiments comprising any other possible combinations. Other structures, configurations, and embodiments will be apparent to those skilled in the art from a consideration of the specification or practice of the invention disclosed herein. It is intended that the specification and the described examples are illustrative with the true scope of the invention being defined by the following claims.

What is claimed is:

1. A data processing device comprising:
a controller configured to control the data processing device to execute steps of:
receiving a data packet comprising a group identification information that identifies a restoration group, with which the data packet is associated, and redundant data for restoring a lost data packet, which is associated with the restoration group identified by the group identification information;
determining whether a received amount of data packet associated with the restoration group identified by the group identification information is equal to or greater than a predetermined value; and
restoring the lost data packet associated with the restoration group identified by the group identification information when the received amount of data packet associated with the restoration group identified by the group identification information is equal to or greater than the predetermined value.

2. The data processing device according to claim 1, wherein the controller is further configured to control the data processing device to execute steps of:
determining whether a predetermined period of time has elapsed after the data packet is received without receiving a next data packet associated with the restoration group;
preventing the restoration of the lost packet associated with the restoration group identified by the received group identification information when the predetermined period of time has elapsed after the data packet is received without receiving the next data packet associated with the restoration to group.

3. The data processing device according to claim 2,
wherein the restoration group corresponds to one of a plurality of frames in a video data and the group identification information identifies the one of the plurality of frames corresponding to the restoration group,
wherein the data packet further comprises at least one of a frame type and a frame rate of the video data; and
wherein the controller is further configured to control the data processing device to execute steps of:
setting the predetermined time based on the at least one of the frame type and the frame rate of the video data.

4. The data processing device according to claim 3,
wherein the frame type comprises at least one of an intra-frame coding and an inter-frame coding;
wherein the predetermined time for the frame type of the intra-frame coding is set greater than the predetermined time for the frame type of the inter-frame coding.

5. The data processing device according to claim 2,
wherein the controller is further configured to control to execute steps of:
determining a communication period of time from when a confirmation data packet is transmitted from the data processing device to an external device to a time when the confirmation data packet is received by the external device;
setting the predetermined time according to the communication period of time.

6. The data processing device according to claim 1, wherein the controller is configured to control the data processing device to restore the lost data pocket using the redundant data in a forward error correction (FEC) process.

7. The data processing device according to claim 1,
wherein the restoration group corresponds to one of a plurality of frames in a video data and the group identification information identifies the one of the plurality of frames corresponding to the restoration group; and
wherein the step of restoring the lost data packet comprises the step of restoring the one of the plurality of frames in the video data.

8. A method for implementing data processing comprising steps of:
receiving a data packet comprising a group identification information that identifies a restoration group, with which the data packet is associated, and redundant data for restoring a lost data packet, which is associated with the restoration group identified by the group identification information;
determining whether a received amount of data packet associated with the restoration group identified by the group identification information is equal to or greater than a predetermined value; and
restoring the lost data packet associated with the restoration group identified by the group identification information when the received amount of data packet associated with the restoration group identified by the group identification information is equal to or greater than the predetermined value.

9. A non-transitory computer readable storage medium storing computer readable instructions that, when executed, cause a data processing device to execute steps of:
receiving a data packet comprising a group identification information that identifies a restoration group, with which the data packet is associated, and redundant data for restoring a lost data packet, which is associated with the restoration group identified by the group identification information;
determining whether a received amount of data packet associated with the restoration group identified by the group identification information is equal to or greater than a predetermined value; and
restoring the lost data packet associated with the restoration group identified by the group identification information when the received amount of data packet associated with the restoration group identified by the group identification information is equal to or greater than the predetermined value.

* * * * *